(12) United States Patent
Chu et al.

(10) Patent No.: US 12,727,242 B2
(45) Date of Patent: Sep. 1, 2026

(54) BACKSIDE PROGRAMMABLE GATE ARRAY

(71) Applicant: International Business Machines Corporation, Armonk, NY (US)

(72) Inventors: Albert M. Chu, Nashua, NH (US); Brent A. Anderson, Jericho, VT (US); Junli Wang, Slingerlands, NY (US); Albert M. Young, Fishkill, NY (US); Ruilong Xie, Niskayuna, NY (US); Carl Radens, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 419 days.

(21) Appl. No.: 18/054,160

(22) Filed: Nov. 10, 2022

(65) Prior Publication Data

US 2024/0162231 A1 May 16, 2024

(51) Int. Cl.
*H10D 84/90* (2025.01)
*G11C 17/10* (2006.01)
(Continued)

(52) U.S. Cl.
CPC ........... *H10D 84/907* (2025.01); *G11C 17/10* (2013.01); *H10B 20/20* (2023.02); *H10D 84/975* (2025.01); *H10D 84/981* (2025.01)

(58) Field of Classification Search
CPC ........... H10W 20/023; H10W 20/0245; H10W 20/0257; H10W 20/481; H10D 84/907; H10D 84/975; H10D 84/981
See application file for complete search history.

(56) References Cited

U.S. PATENT DOCUMENTS 8,174,124 B2 5/2012 Chiu et al.
9,418,728 B2 * 8/2016 Liaw ........................ G11C 8/16
(Continued)

FOREIGN PATENT DOCUMENTS

WO 2009017923 A1 2/2009

OTHER PUBLICATIONS

Hsu et al., "Backside-TSV process development and integration for 2~3um small size TSV" 2016 International Symposium on Microsystems, Packaging, Assembly and Circuits Technology Conference (IMPACT) (2016): pp. 273-276.
(Continued)

*Primary Examiner* — Yara B Green
*Assistant Examiner* — Akhee Sarker-Nag
(74) *Attorney, Agent, or Firm* — Cantor Colburn LLP; Kimberly Zillig

(57) ABSTRACT

Embodiments of the present invention are directed to processing methods and resulting structures for integrated circuits having backside programmable gate arrays. In a non-limiting embodiment, a front end of line structure having an array of transistors is formed such that each transistor of the array of transistors includes one or more placeholder backside vias. A first portion of the backside vias defines one or more placeholder backside vias and a second portion of the one or more backside vias defines one or more programmed backside vias. A back end of line structure is formed on a first surface of the front end of line structure. A backside structure is formed on a second surface of the front end of line structure opposite the first surface. The backside structure includes a backside metallization layer in direct contact with the one or more programmed backside vias.

17 Claims, 8 Drawing Sheets

(51) Int. Cl.
*H10B 20/00* (2023.01)
*H10B 20/20* (2023.01)

(56) References Cited

U.S. PATENT DOCUMENTS

| | | | | |
|---|---|---|---|---|
| 9,431,298 | B2 | 8/2016 | Perry et al. | |
| 9,455,214 | B2 | 9/2016 | Maling et al. | |
| 9,870,979 | B2 | 1/2018 | Batra et al. | |
| 10,381,376 | B1 | 8/2019 | Nishikawa et al. | |
| 10,672,831 | B2 | 6/2020 | Wang et al. | |
| 11,041,211 | B2 | 6/2021 | Jain | |
| 11,049,782 | B2 | 6/2021 | Lee et al. | |
| 11,094,714 | B2 | 8/2021 | Chen et al. | |
| 11,121,086 | B2 | 9/2021 | Hiblot et al. | |
| 2021/0242322 | A1* | 8/2021 | Liang | H10D 62/121 |
| 2021/0343332 | A1* | 11/2021 | Chiu | G11C 11/412 |
| 2021/0375883 | A1* | 12/2021 | Hsu | H10B 10/12 |
| 2022/0093523 | A1 | 3/2022 | Shanmugam et al. | |
| 2022/0181258 | A1 | 6/2022 | Liebmann et al. | |

OTHER PUBLICATIONS

List of IBM Patents or Patent Applications Treated as Related; Date Filed: Nov. 10, 2022—2 pages.

Chu et al., "Backside Programmable Memory," U.S. Appl. No. 18/054,161, filed Nov. 10, 2022.

* cited by examiner 118
208
302
602
408
604
114/116
606

118
208
302
602
408
302
114/116
608

118
208
302
602
408
612
114/116
610
610

BACKSIDE PROGRAMMABLE GATE ARRAY

BACKGROUND

The present invention generally relates to fabrication methods and resulting structures for semiconductor devices, and more specifically, to processing methods and resulting structures for a backside programmable gate array.

The development of an integrated circuit (i.e., chip) involves several stages from design through fabrication. Many aspects of the development are performed iteratively to ensure that the chip ultimately manufactured meets all design requirements. Defining the chip architecture is one of the earliest phases of integrated circuit development. The power (e.g., power requirement), performance (e.g., timing), and area (i.e., space needed) for the resulting chip, collectively PPA, is one of the primary metrics by which integrated circuits are evaluated. PPA is largely a consequence of the chip architecture.

Semiconductor fabrication continues to evolve towards improving one or more aspects of PPA. For example, a higher number of active devices (mainly transistors) of ever decreasing device dimensions are placed on a given surface of semiconductor material. Density scaling has put a strain on the design and fabrication of the interconnects between the front end of line of the integrated circuit, consisting mainly of the active devices, and the contact terminals of the integrated circuit. In many chip architectures, all of these interconnects are incorporated in the back end of line (BEOL) structure of the integrated circuit, which includes a stack of metallization layers and vertical via connections built on top of the front end of line (FEOL) structure.

A key component of the BEOL structure is the power delivery network (PDN). The PDN of an integrated circuit is defined by the conductors and vias connected to the power supply (VDD) and ground (VSS) terminals of the chip. The PDN is responsible for delivering power to the individual devices in the front end. The integration of the PDN in the BEOL has become particularly challenging as device densities continue to scale. Backside power delivery is one known solution to this problem, and involves moving some (or most, or all) layers of the PDN from the front side of the integrated circuit to the back side. In a backside-style architecture, the repositioned layers are not formed on top of the FEOL, but are instead formed on the opposite side of the chip (i.e., on the backside of the semiconductor substrate onto which the active devices have been built).

SUMMARY

Embodiments of the invention are directed to a method for providing a backside programmable gate array. A non-limiting example of the method includes forming a front end of line structure having an array of transistors such that each transistor of the array of transistors includes one or more backside vias in direct contact with a source/drain region of the respective transistor and one or more backside vias in direct contact with a gate of the respective transistor. A first portion of the backside vias defines one or more placeholder backside vias and a second portion of the one or more backside vias defines one or more programmed backside vias. A back end of line structure is formed on a first surface of the front end of line structure. A backside structure is formed on a second surface of the front end of line structure opposite the first surface. The backside structure includes a backside metallization layer in direct contact with the one or more programmed backside vias.

Embodiments of the invention are directed to a semiconductor structure. A non-limiting example of the semiconductor structure includes a front end of line structure having an array of transistors. Each transistor of the array of transistors includes one or more backside vias in direct contact with a source/drain region of the respective transistor and one or more backside vias in direct contact with a gate of the respective transistor. A first portion of the backside vias defines one or more placeholder backside vias and a second portion of the one or more backside vias defines one or more programmed backside vias. The structure further includes a back end of line structure on a first surface of the front end of line structure and a backside structure on a second surface of the front end of line structure opposite the first surface. The backside structure includes a backside metallization layer in direct contact with the one or more programmed backside vias.

Embodiments of the invention are directed to a semiconductor structure. A non-limiting example of the semiconductor structure includes a front end of line structure having an array of transistors. Each transistor of the array of transistors includes one or more placeholder backside vias in direct contact with a source/drain region of the respective transistor and one or more placeholder backside vias in direct contact with a gate of the respective transistor. The structure further includes a back end of line structure on a first surface of the front end of line structure.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figures 1A, 1B:
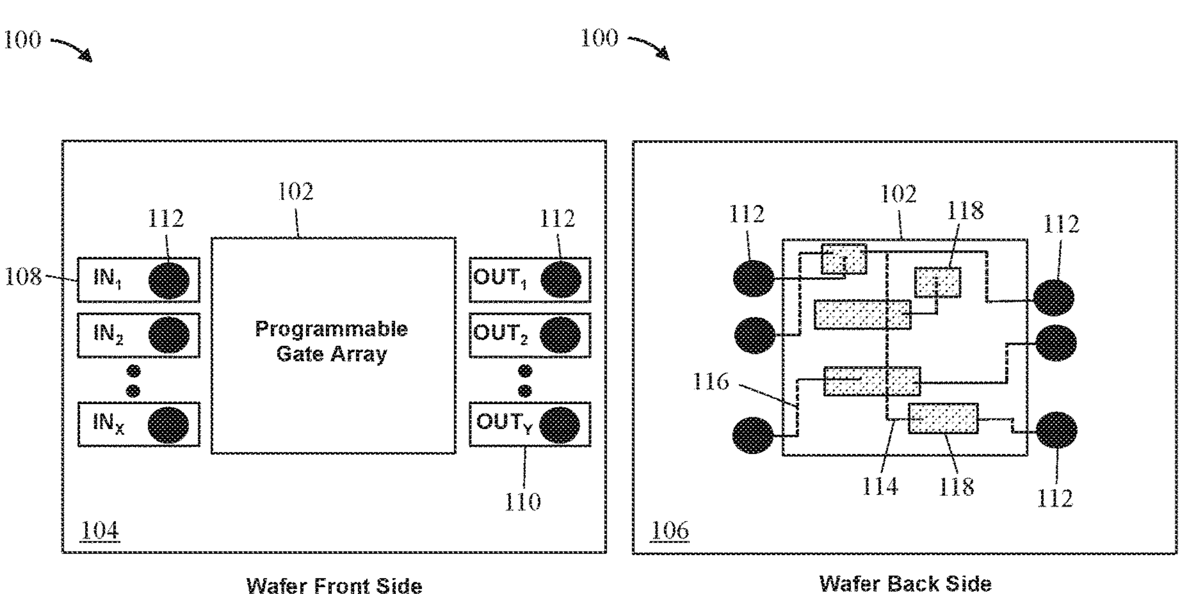
FIG. 1A depicts a front side, top-down view of an integrated circuit having a backside programmable gate array according to one or more embodiments of the invention.
FIG. 1B depicts a back side, top-down view of the integrated circuit according to one or more embodiments of the invention.

The diagrams depicted herein are illustrative. There can be many variations to the diagram or the operations described therein without departing from the spirit of the invention. For instance, the actions can be performed in a differing order or actions can be added, deleted or modified.

In the accompanying figures and following detailed description of the described embodiments of the invention, the various elements illustrated in the figures are provided with two or three-digit reference numbers. With minor exceptions, the leftmost digit(s) of each reference number correspond to the figure in which its element is first illustrated.

DETAILED DESCRIPTION

It is understood in advance that although example embodiments of the invention are described in connection with a particular transistor architecture, embodiments of the invention are not limited to the particular transistor architectures or materials described in this specification. Rather, embodiments of the present invention are capable of being implemented in conjunction with any other type of transistor architecture or materials now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, ICs are fabricated in a series of stages, including a front-end-of-line (FEOL) stage, a middle-of-line (MOL) stage, and a back-end-of-line (BEOL) stage. The process flows for fabricating modern ICs are often identified based on whether the process flows fall in the FEOL stage, the MOL stage, or the BEOL stage. Generally, the FEOL stage is where device elements (e.g., transistors, capacitors, resistors, etc.) are patterned in the semiconductor substrate/wafer. The FEOL stage processes include wafer preparation, isolation, gate patterning, and the formation of wells, source/drain (S/D) regions, extension junctions, silicide regions, and liners. The MOL stage typically includes process flows for forming the contacts (e.g., CA) and other structures that communicatively couple to active regions (e.g., gate, source, and drain) of the device element. For example, the silicidation of source/drain regions, as well as the deposition of metal contacts, can occur during the MOL stage to connect the elements patterned during the FEOL stage. Layers of interconnections (e.g., metallization layers) are formed above these logical and functional layers during the BEOL stage to complete the IC. Most ICs need more than one layer of wires to form all the necessary connections, and as many as 5-12 layers are added in the BEOL process. The various BEOL layers are interconnected by vias that couple from one layer to another. Insulating dielectric materials are used throughout the layers of an IC to perform a variety of functions, including stabilizing the IC structure and providing electrical isolation of the IC elements. For example, the metal interconnecting wires in the BEOL region of the IC are isolated by dielectric layers to prevent the wires from creating a short circuit with other metal layers.

As discussed previously, a key component of the BEOL structure is the power delivery network (PDN). Backside power delivery (also referred to as a backside power delivery network) is a chip architecture that involves repositioning conductive (metal) layers of the PDN from the top of the FEOL to the opposite side of the chip. In other words, in a backside-style architecture the PDN layers are placed on the backside of the semiconductor substrate onto which the active devices have been built. Challenges remain, however, in fully leveraging backside metal architectures, such as the backside power delivery network, for next generation chip design and fabrication.

Generally, current wafer designs undergo a fabrication work flow where each respective wafer is sequentially FEOL processed, frontside BEOL processed, MOL processed, flipped, thinned, backside BEOL processed, and then finished (e.g., far back end of line or FBEOL, packaging, etc.). Making changes to any of the logic circuits of each respective wafer requires a somewhat iterative process, whereby a new frontside mask is created and the sequential fabrication process restarts at the FEOL. Unfortunately, changes to the frontside mask impacts all downstream modules and results in a relatively long time-to-market.

Turning now to an overview of aspects of the present invention, one or more embodiments of the invention address the above-described shortcomings by providing fabrication methods and resulting structures for a backside programmable gate array. As used herein, a "backside programmable gate array" refers to a structural feature of one or more embodiments of this disclosure where an array of placeholder backside vias (also referred to as dummy backside vias) are built at the backside of a wafer so that a gate array image can be customized simply by changing the electrical contact to one or more of the placeholder backside vias. In short, template logic circuits having predefined arrays of transistors are formed on the front side of the wafer, and metals and vias are formed on the back side of the wafer to program the logic circuits (by contacting the transistors) into a logical functional circuits. The backside vias themselves can be built during FEOL (e.g., after the source/drain recess) and/or MOL (e.g., deep via formation towards backside), as desired.

Advantageously, configuring a backside programmable gate array in this manner allows for design changes to be made to on-chip logic circuits without requiring a new frontside mask. Instead, the logic circuits can be customized via a new backside mask without redoing the FEOL and the frontside BEOL, greatly reducing time-to-market. The backside mask can be changed to redefine which ones of the placeholder backside vias will be electrically coupled to the backside metal (e.g., a backside power delivery network) during the backside BEOL. This process can be referred to as "backside programming".

Backside programming enables a new type of two-phase wafer fabrication scheme where the front side of each wafer is processed with transistor arrays that are programmable late in the wafer process cycle. In other words, wafer fabrication can be split into two general components: the frontside portion and the backside portion. The frontside portion includes the FEOL, the frontside BEOL, and in some scenarios, the MOL (i.e., in embodiments where placeholder vias are built MOL). The backside portion includes wafer thinning, the backside BEOL, and finishing modules. Notably, the FEOL and the frontside BEOL remain unchanged following any backside mask updates.

In some embodiments, a first, nontrusted foundry handles the frontside portion of wafer fabrication (including the creation of predefined arrays of transistors and one or more placeholder backside vias) and a second, trusted foundry completes wafer fabrication (including electrically coupling one or more placeholder backside vias to backside metal to define the logic circuits built from the transistors). Advantageously, splitting the handling of wafer fabrication in this manner allows for secured wafer customization (via backside programming) while still allowing nontrusted foundries to complete the bulk of the fabrication process (i.e., through the frontside BEOL).

Turning now to a more detailed description of fabrication operations and resulting structures according to aspects of the invention, FIGS. 1A and 1B depict top-down views of an integrated circuit 100 having a backside programmable gate array 102 in accordance with one or more embodiments of the invention. FIG. 1A depicts the front side 104 of the integrated circuit 100 and FIG. 1B depicts the back side 106 of the integrated circuit 100.

As shown in FIG. 1A, the front side 104 of the integrated circuit 100 includes one or more input front side metal connections 108 (e.g., $IN_1$, $IN_2$, . . . , $IN_X$) and one or more output front side metal connections 110 (e.g., $OUT_1$, $OUT_2$, . . . , $OUT_Y$). The specific number and configuration of the input front side metal connections 108 and the output front side metal connections 110 is provided for ease of illustration and discussion only and is not meant to be particularly limited. The integrated circuit 100 can include any number of front side metal connections and all such configurations are within the contemplated scope of this disclosure.

Observe that none of the input front side metal connections 108 and none of the output front side metal connections 110 make direct contact to the backside programmable gate array 102 on the front side 104 of the integrated circuit 100. Instead, as further shown in FIG. 1A, the front side 104 of the integrated circuit 100 includes one or more through silicon vias (TSVs) 112. In some embodiments, each of the input front side metal connections 108 and each of the output front side metal connections 110 includes a TSV 112. As shown in FIG. 1B, in some embodiments, the one or more TSVs 112 extend to the back side 106 of the integrated circuit 100.

As further shown in FIG. 1B, the input front side metal connections 108 and the output front side metal connections 110 make electrical contact, by way of the TSVs 112, to the backside programmable gate array 102 on the back side 106 of the integrated circuit 100. The back side 106 of the integrated circuit 100 includes a plurality of backside metal lines and vias 114, 116 (where, as shown, lines and vias 114 are represented by a solid line, while lines and vias 116 are represented by a dashed line). In some embodiments, the metal lines and vias 114 define a first backside metallization layer (e.g., $BSM_1$) and the metal lines and vias 116 define a second backside metallization layer (e.g., $BSM_2$). While shown as having two backside metallization layers for ease of illustration and discussion, the integrated circuit 100 can include any number of backside metallization layers (e.g., $BSM_1$ . . . $BSM_X$) and all such configurations are within the contemplated scope of this disclosure.

In some embodiments, the back side 106 of the integrated circuit 100 includes gate array image regions 118, each having an array of placeholder backside vias (not separately indicated) that can be electrically coupled to the one or more TSVs 112 via the plurality of metal lines and vias 114, 116. The placeholder backside vias are discussed in more detail with respect to FIG. 2. In some embodiments, each of the gate array image regions 118 can be customized to provide a desired logic function (i.e., NAND, INV, SDFF, etc.) by metalizing and/or otherwise electrically coupling a subset (or all) of the one or more placeholder backside vias to the plurality of metal lines and vias 114, 116. Making electrical contact to one or more of the placeholder backside vias in this manner can be referred to as "programming" the respective placeholder backside vias. The programming of placeholder backside vias is discussed in more detail with respect to FIGS. 3A and 3B.

Figure 2:
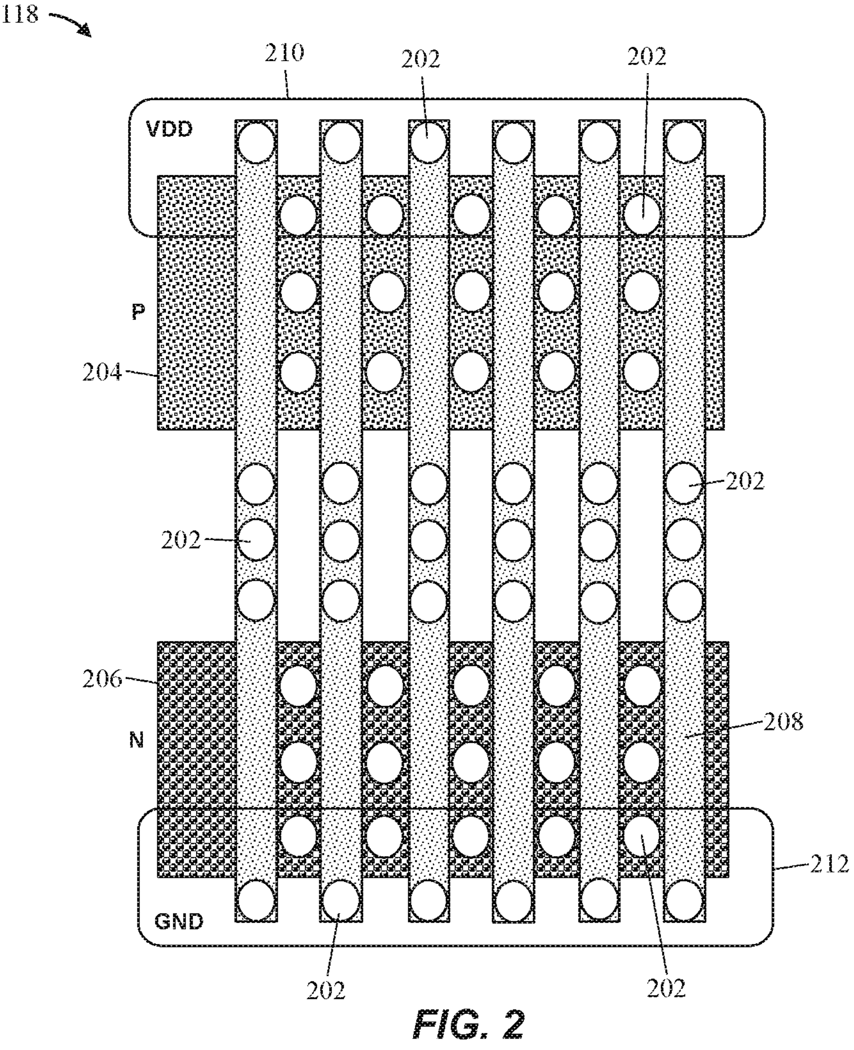
FIG. 2 depicts a layout view of an example gate array image region configured in accordance with one or more embodiments of the invention.

FIG. 2 depicts a layout view of an example gate array image region 118 configured in accordance with one or more embodiments of the invention. As shown in FIG. 2, the gate array image region 118 includes a plurality of placeholder backside vias 202. In some embodiments, the gate array image region 118 is configured as a complementary metal-oxide-semiconductor (CMOS) circuit having a PFET source/drain region 204, an NFET source/drain region 206, a plurality of gates 208, a voltage source ("VDD") 210, and a ground ("GND") 212. Other configurations, including non-CMOS circuits, are possible, and all such configurations are within the contemplated scope of this disclosure.

In some embodiments, one or more of the placeholder backside vias 202 are distributed across each of the PFET source/drain region 204, the NFET source/drain region 206, and the plurality of gates 208, although the specific configuration and/or distribution of the placeholder backside vias 202 is not meant to be particularly limited. The particular configuration shown in FIG. 2 (having five placeholder backside vias 202 along each of the gates 208 and three placeholder backside vias 202 in each of the source/drain regions) is for ease of discussion and illustration only; other configurations are possible, and all such configurations are within the contemplated scope of this disclosure. As discussed previously, in some embodiments, various logic circuits can be formed from predefined arrays of transistors on the front side of a wafer with frontside wiring (not separately shown). In some embodiments, these transistor arrays contain predefined locations for the placeholder backside vias 202.

Figures 3A, 3B:
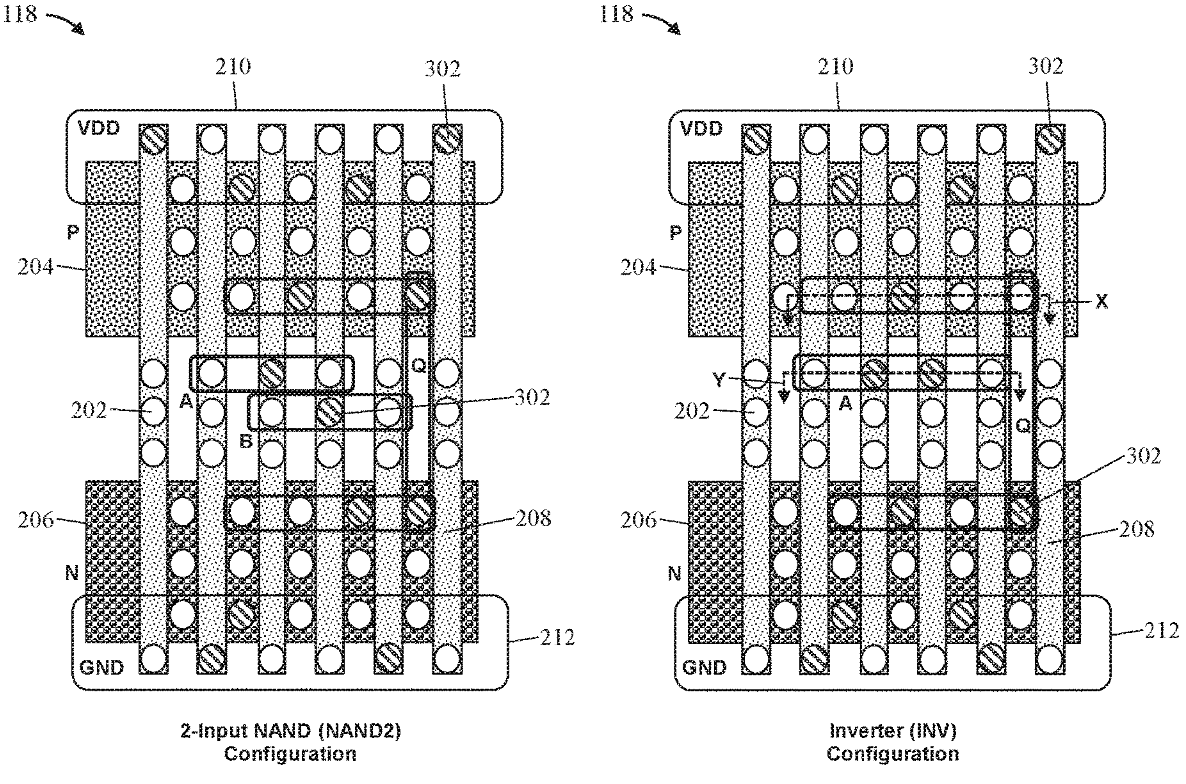
FIG. 3A depicts a layout view of an example gate array image region configured as a 2-input NAND ("NAND2") in accordance with one or more embodiments of the invention.
FIG. 3B depicts a layout view of an example gate array image region configured as an inverter ("INV") in accordance with one or more embodiments of the invention.

FIGS. 3A and 3B depict layout views of example gate array image regions 118 configured as a 2-input NAND ("NAND2") and as an inverter ("INV"), respectively, in accordance with one or more embodiments of the invention. As shown in FIG. 3A, one or more of the array image regions 118 can be configured as a 2-input NAND by programming (that is, contacting/metalizing) a specific subset of the placeholder backside vias 202 to define a first input ("A"), a second input ("B"), an output ("Q"), and to ensure contact to the VDD 210 and the GND 212. Each via programmed in this manner can be referred to as a programmed backside via 302 (represented by a diagonal hash pattern).

Similarly, as shown in FIG. 3B, one or more of the array image regions 118 can be configured as an inverter by programming (that is, contacting/metalizing) a specific subset of the placeholder backside vias 202 to define an input ("A"), an output ("Q"), and to ensure contact to the VDD 210 and the GND 212. Each via programmed in this manner can also be referred to as a programmed backside via 302.

The specific logic circuits shown in FIGS. 3A and 3B (e.g., NAND2 and INV, respectively) is for ease of illustration and discussion only. Other logic circuits, such as, for example, OR, NOR, XOR, XNOR, AND, MUX, LATCH, etc., can be defined by programming respective subsets of the placeholder backside vias 202 and all such configurations are within the contemplated scope of this disclosure. Observe that, advantageously, any number of different types of logic circuits can be defined from the same base configuration of array image regions 118 by programming different subsets of the placeholder backside vias 202.

Figure 4A:
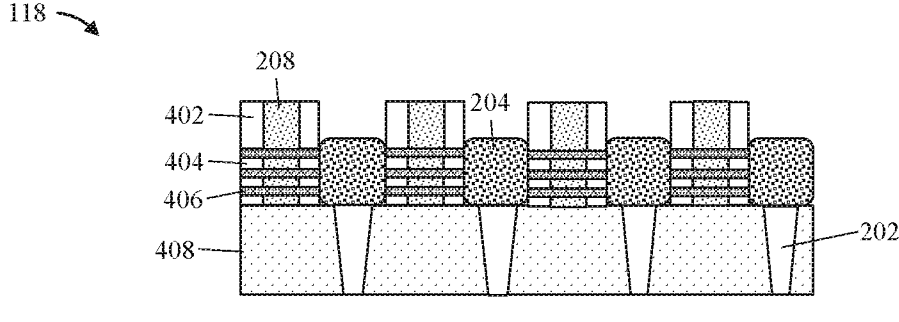
FIG. 4A depicts a cross-sectional view of a portion of the example gate array image region shown in FIG. 3B along the line "X" in a pre-programming state in accordance with one or more embodiments of the invention.
Figure 4B:
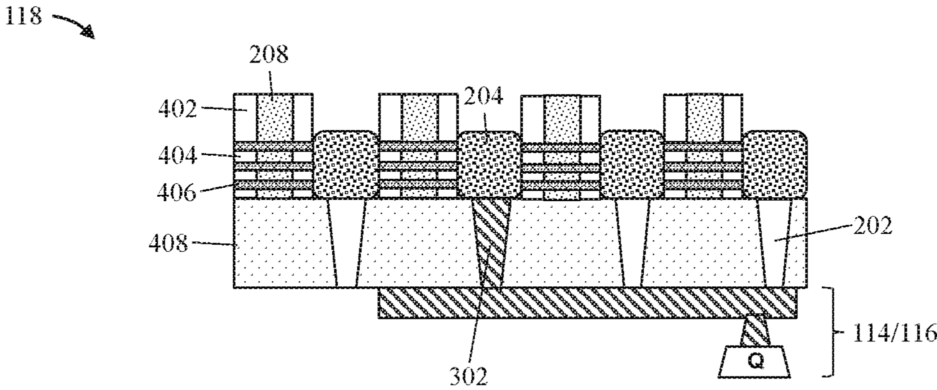
FIG. 4B depicts a cross-sectional view of a portion of the example gate array image region shown in FIG. 3B along the line "X" in a post-programming state in accordance with one or more embodiments of the invention.

FIGS. 4A and 4B depict cross-sectional views of a portion of the example gate array image region 118 shown in FIG. 3B along the line "X" in a pre-programming and post-programming state, respectively, in accordance with one or more embodiments of the invention. As shown in FIG. 4A, the gate array image region 118 can include placeholder backside vias 202, PFET source/drain region 204, gates 208, as well as gate spacers 402, inner spacers 404, nanosheets 406, and interlayer dielectrics 408 (additional dielectrics omitted for clarity), formed using FEOL processes. The gate array image region 118 is shown having a nanosheet-style transistor architecture. It should be understood that the nanosheet-style transistor architecture is provided for ease of discussion and illustration only, and that other transistor architectures (e.g., vertical tunneling transistors, planar transistors, finFETs, etc.) are within the contemplated scope of this disclosure.

In some embodiments, the placeholder backside vias 202 can be formed using dielectric materials, such as, for example, silicon dioxide, silicon nitride, etc. In some embodiments, one or more of the placeholder backside vias 202 are formed in the FEOL. For example, in some embodiments, one or more trenches (not separately shown) are formed following the source/drain recess module and prior to source/drain epitaxial growth. Each trench can be filled with dielectric material to define a placeholder backside via 202. Fabrication can then continue using known FEOL, MOL, and BEOL processes, except that the placeholder backside vias 202 formed frontside during the FEOL are exposed from the backside following wafer flip and the backside thinning module. Once exposed, any number of placeholder backside vias 202 can be replaced with programmed backside vias 302 according to one or more embodiments.

In some embodiments, one or more of the placeholder backside vias 202 are formed in the MOL. For example, in some embodiments, one or more deep via trenches (not separately shown) are formed from the frontside to extend towards the backside after the replacement metal gate (RMG) module. Wafer fabrication can then proceed using known processes (e.g., MOL, BEOL, etc.), except that the deep vias formed frontside during the MOL are exposed from the backside following wafer flip and the backside thinning module. The exposed deep vias can be programmed (e.g., metalized and/or otherwise electrically coupled) to backside metal wiring according to one or more embodiments.

As shown in FIG. 4B, one or more of the placeholder backside vias 202 in the gate array image region 118 can be "programmed" by replacing the dielectric material with conductive material, such as, for example, copper, tungsten, etc. After programming, the vias are referred to as programmed backside vias 302. Once programming is complete (e.g., after metallization of one or more of the placeholder backside vias 202), the programmed backside vias 302 can be electrically coupled to backside wiring (e.g., the backside metal lines and vias 114, 116, including the output Q). The backside wiring is shown for ease of illustration and discussion only and is not meant to be particularly limited. In some embodiments, backside wiring electrically contacts multiple backside vias. In some embodiments, backside wiring electrically connects an output from a first logic functional circuit A to a gate input for a second logic functional circuit B (not separately shown). In some embodiments, backside wiring is formed between a pair of through device region vias (e.g., programmed backside vias 302) in a manner that passes over one or more dummy through device region vias (e.g., placeholder backside vias 202).

Figure 5A:
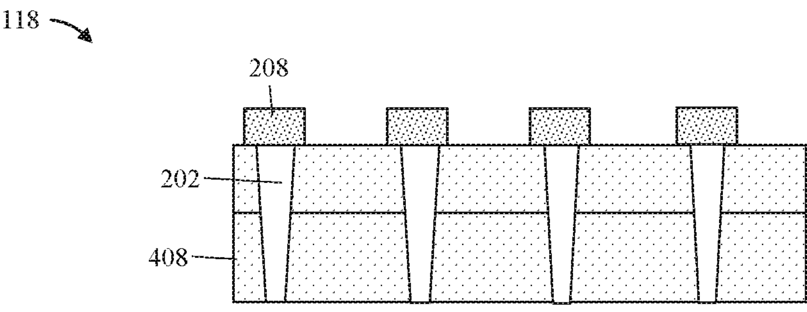
FIG. 5A depicts a cross-sectional view of a portion of the example gate array image region shown in FIG. 3B along the line "Y" in a pre-programming state in accordance with one or more embodiments of the invention.
Figure 5B:
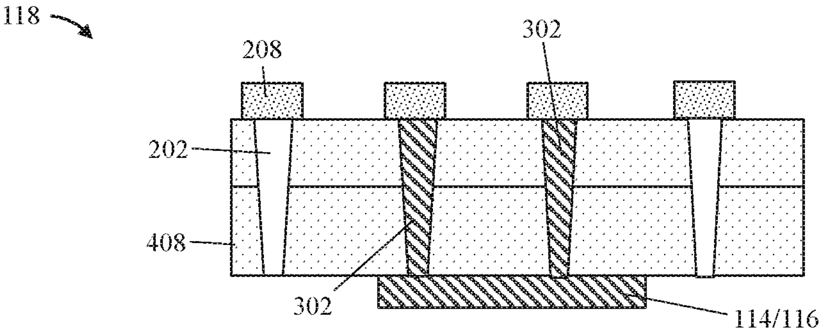
FIG. 5B depicts a cross-sectional view of a portion of the example gate array image region shown in FIG. 3B along the line "Y" in a post-programming state in accordance with one or more embodiments of the invention.

FIGS. 5A and 5B depict cross-sectional views of a portion of the example gate array image region 118 shown in FIG. 3B along the line "Y" in a pre-programming and post-programming state, respectively, in accordance with one or more embodiments of the invention. As shown in FIG. 5A, the gate array image region 118 can include placeholder backside vias 202, gates 208, and interlayer dielectrics 408, formed using FEOL processes. The placeholder backside vias 202 can be formed using dielectric materials, such as, for example, silicon dioxide, silicon nitride, etc., as discussed previously. FIG. 5B depicts the example gate array image region 118 after programming one or more of the placeholder backside vias 202 by replacing the dielectric material with conductive material, such as, for example, copper, tungsten, etc. Continuing from the prior example, second and third placeholder backside vias 202 are metallized and electrically coupled to backside wiring (e.g., the backside metal lines and vias 114, 116). The resulting programmed backside vias 302 represent the inverter input A (refer to FIG. 3B).

Figures 6A, 6B, 6C:
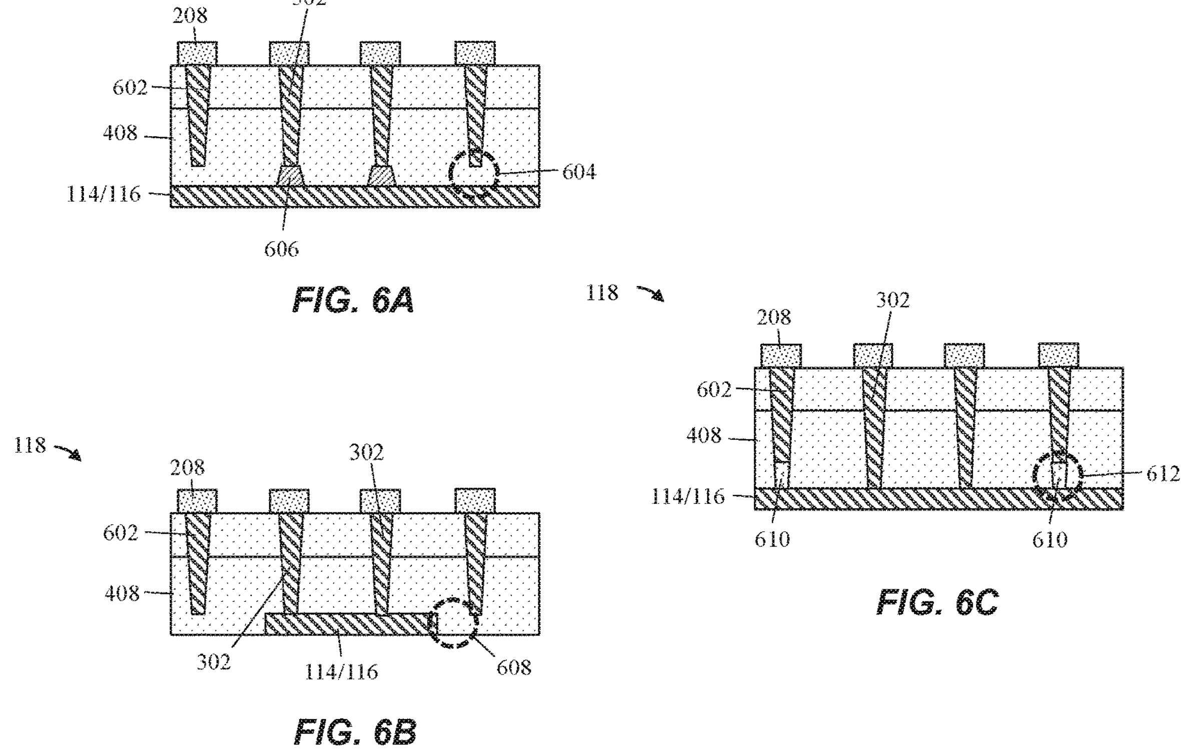
FIG. 6A depicts a cross-sectional view of a portion of the example gate array image region shown in FIG. 3B along the line "Y" in accordance with one or more alternative embodiments of the invention.
FIG. 6B depicts a cross-sectional view of a portion of the example gate array image region shown in FIG. 3B along the line "Y" in accordance with another alternative embodiment of the invention.
FIG. 6C depicts a cross-sectional view of a portion of the example gate array image region shown in FIG. 3B along the line "Y" in accordance with yet another alternative embodiment of the invention.

FIG. 6A depicts a cross-sectional view of a portion of the example gate array image region 118 shown in FIG. 3B along the line "Y" in an alternative embodiment from that shown in FIG. 5B. In contrast to the embodiment shown in FIG. 5B, in some embodiments, all of the placeholder backside vias 202 are prefilled with conductive material (forming, effectively, a plurality of placeholder conductive backside vias 602). In some embodiments, the placeholder conductive backside vias 602 are electrically isolated from the backside wiring (e.g., the backside metal lines and vias 114, 116) by dielectrics (e.g., the interlayer dielectrics 408), as shown in region 604. In some embodiments, one or more of the placeholder conductive backside vias 602 are programmed by forming an backside extension via 606 on the respective via. The backside extension via 606 can be electrically coupled to the backside wiring (e.g., the backside metal lines and vias 114, 116). Placeholder conductive backside vias 602 coupled to the backside wiring via the backside extension via 606 can be referred to as programmed backside vias 302.

FIG. 6B depicts a cross-sectional view of a portion of the example gate array image region 118 shown in FIG. 3B along the line "Y" in an alternative embodiment from that shown in FIG. 5B. In contrast to the embodiment shown in FIG. 5B, in some embodiments, all of the placeholder backside vias 202 are prefilled with conductive material (forming, effectively, a plurality of placeholder conductive backside vias 602). In some embodiments, the backside wiring (e.g., the backside metal lines and vias 114, 116) is configured such that contact is made only to selected ones of the placeholder conductive backside vias 602. Remaining (unselected) placeholder conductive backside vias 602 are electrically isolated from the backside wiring (e.g., the backside metal lines and vias 114, 116) by dielectrics (e.g., the interlayer dielectrics 408), as shown in region 608. The backside wiring can be patterned using known positive and negative lithographic techniques. Placeholder conductive backside vias 602 coupled to the backside wiring can be referred to as programmed backside vias 302.

FIG. 6C depicts a cross-sectional view of a portion of the example gate array image region 118 shown in FIG. 3B along the line "Y" in an alternative embodiment from that shown in FIG. 5B. In contrast to the embodiment shown in FIG. 5B, in some embodiments, all of the placeholder backside vias 202 are prefilled with conductive material (forming, effectively, a plurality of placeholder conductive backside vias 602). In some embodiments, one or more of the placeholder conductive backside vias 602 are recessed to prevent contact to the backside wiring (e.g., the backside metal lines and vias 114, 116). In some embodiments, one or more of the placeholder conductive backside vias 602 are recessed and the removed conductive material is replaced with dielectric material 610, as shown in region 612. Remaining placeholder conductive backside vias 602 are electrically coupled to the backside wiring (e.g., the backside metal lines and vias 114, 116). Placeholder conductive backside vias 602 coupled to the backside wiring can be referred to as programmed backside vias 302.

Figure 7:
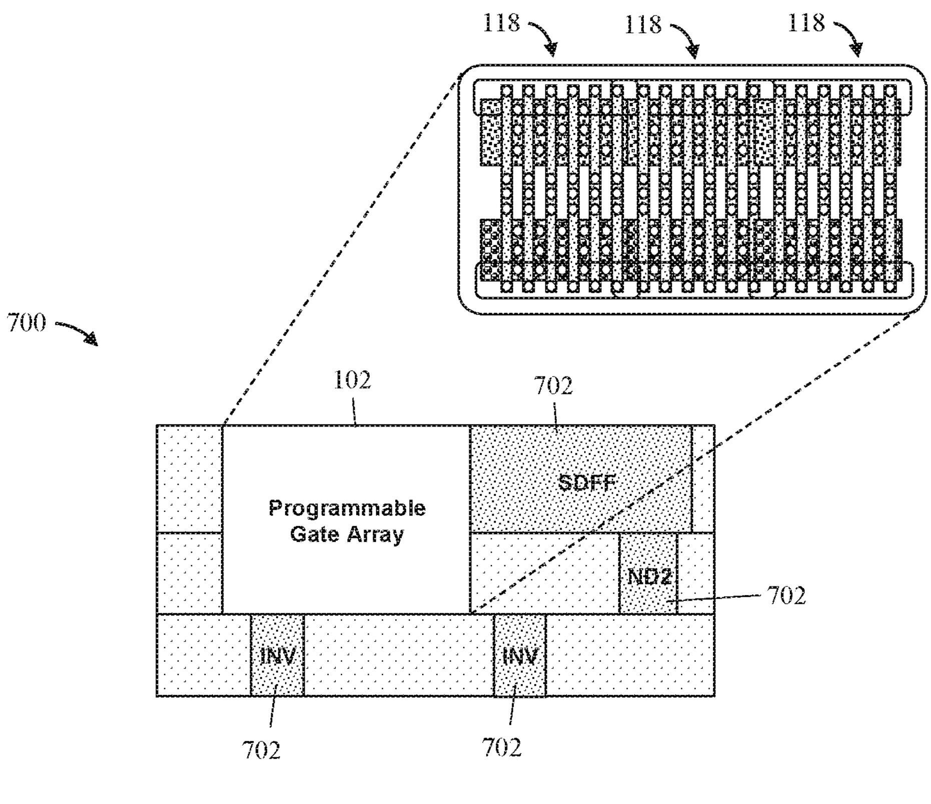
FIG. 7 depicts a top-down view of an integrated circuit having a backside programmable gate array formed in accordance with one or more embodiments of the invention.

FIG. 7 depicts a top-down view of an integrated circuit 700 having a backside programmable gate array 102 formed in accordance with one or more embodiments of the invention. As shown in FIG. 7, in some embodiments, one or more backside programmable gate arrays 102 can be intermixed with one or more standard cells 702 (as shown for example only, two inverter (INV) cells, a semi-dynamic flip-flop (SDFF) cell, and a 2-input NAND (ND2) cell). As further shown in FIG. 7, the backside programmable gate array 102 can include a plurality of gate array image regions 118, each formed according to one or more embodiments.

Figure 8:
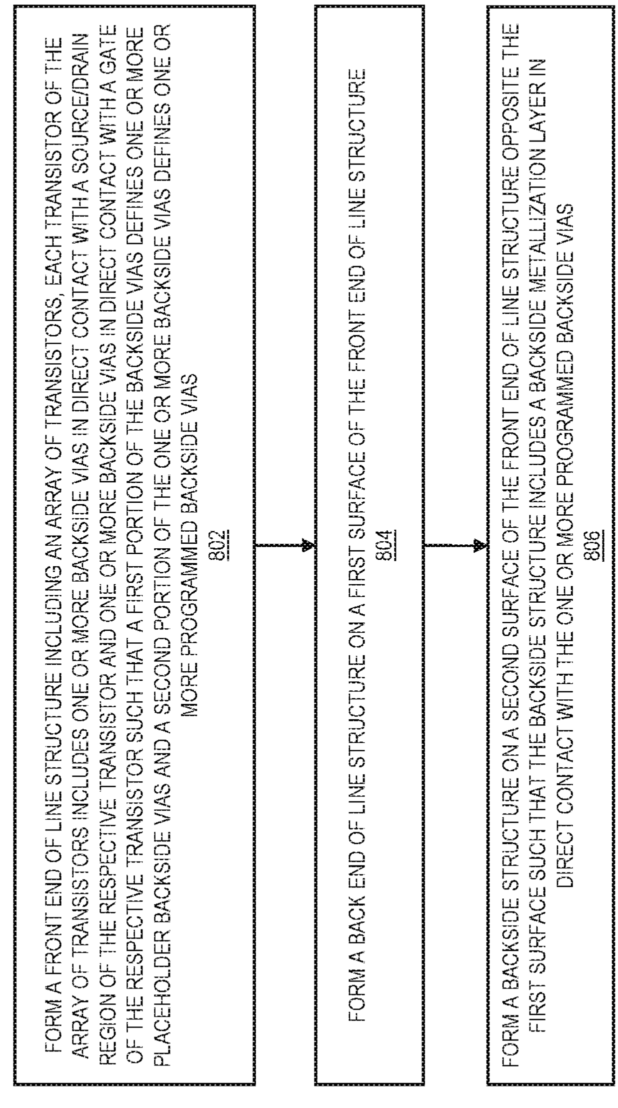
FIG. 8 depicts a flow diagram illustrating a method according to one or more embodiments of the invention.

FIG. 8 depicts a flow diagram illustrating a method 800 for providing integrated circuits having backside programmable gate arrays according to one or more embodiments of the invention. As shown at block 802, a front end of line structure having an array of transistors is formed. In some embodiments, each transistor of the array of transistors includes one or more backside vias in direct contact with a source/drain region of the respective transistor and one or more backside vias in direct contact with a gate of the respective transistor. In some embodiments, a first portion of the backside vias defines one or more placeholder backside vias and a second portion of the one or more backside vias defines one or more programmed backside vias.

At block 804, a back end of line structure is formed on a first surface of the front end of line structure.

At block 806, a backside structure is formed on a second surface of the front end of line structure opposite the first surface. In some embodiments, the backside structure includes a backside metallization layer in direct contact with the one or more programmed backside vias. In some embodiments, the backside structure includes a backside power delivery network.

In some embodiments, the one or more placeholder backside vias include a dielectric material and the one or more programmed backside vias include a conductive material. In some embodiments, the backside metallization layer is in direct contact with the one or more backside vias.

In some embodiments, the one or more placeholder backside vias and the one or more programmed backside vias include a conductive material. In some embodiments, for each of the one or more programmed backside vias, a backside extension via is formed between the backside metallization layer and the respective programmed backside via. In some embodiments, the backside metallization layer is patterned to prevent direct contact with the one or more placeholder backside vias. In some embodiments, the one or more placeholder backside vias are recessed with respect to the one or more programmed backside vias to prevent direct contact with the backside metallization layer.

In some embodiments, the one or more programmed backside vias are selected such that a portion of the array of transistors defines a logic functional circuit (e.g., NAND2, INV, LATCH, etc.).

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (e.g., rotated 90 degrees or at other orientations), and the spatially relative descriptors used herein should be interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop (i.e., the second element remains).

The term "conformal" (e.g., a conformal layer or a conformal deposition) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a <100> orientated crystalline surface can take on a <100> orientation. In some embodiments of the invention of the invention, epitaxial growth and/or deposition processes can be selective to forming on semiconductor surface, and may or may not deposit material on other exposed surfaces, such as silicon dioxide or silicon nitride surfaces.

As used herein, "p-type" refers to the addition of impurities to an intrinsic semiconductor that creates deficiencies of valence electrons. In a silicon-containing substrate, examples of p-type dopants, i.e., impurities, include but are not limited to, boron, aluminum, gallium, and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a semiconductor device, the method comprising:

forming a front end of line structure comprising an array of transistors, each transistor of the array of transistors comprising one or more backside vias in direct contact with a source/drain region of the respective transistor and one or more backside vias in direct contact with a gate of the respective transistor, wherein a first portion of the backside vias defines one or more placeholder backside vias and a second portion of the one or more backside vias defines one or more programmed backside vias;

forming a back end of line structure on a first surface of the front end of line structure; and forming a backside structure on a second surface of the front end of line structure opposite the first surface, the backside structure comprising a backside metallization layer in direct contact with the one or more programmed backside vias.

2. The method of claim 1, wherein the backside structure comprises a backside power delivery network.

3. The method of claim 1, wherein the one or more placeholder backside vias comprise a dielectric material and the one or more programmed backside vias comprise a conductive material.

4. The method of claim 3, wherein the backside metallization layer is in direct contact with the one or more backside vias.

5. The method of claim 1, wherein the one or more placeholder backside vias and the one or more programmed backside vias comprise a conductive material.

6. The method of claim 5, further comprising, for each of the one or more programmed backside vias, a backside extension via between the backside metallization layer and the respective programmed backside via.

7. The method of claim 5, wherein the backside metallization layer is patterned to prevent direct contact with the one or more placeholder backside vias.

8. The method of claim 5, wherein the one or more placeholder backside vias are recessed with respect to the one or more programmed backside vias to prevent direct contact with the backside metallization layer.

9. The method of claim 1, wherein the one or more programmed backside vias are selected such that a portion of the array of transistors defines a logic functional circuit.

10. A semiconductor device comprising:

a front end of line structure comprising an array of transistors, each transistor of the array of transistors comprising one or more backside vias in direct contact with a source/drain region of the respective transistor and one or more backside vias in direct contact with a gate of the respective transistor, wherein a first portion of the backside vias defines one or more placeholder backside vias and a second portion of the one or more backside vias defines one or more programmed backside vias;

a back end of line structure on a first surface of the front end of line structure; and a backside structure on a second surface of the front end of line structure opposite the first surface, the backside structure comprising a backside metallization layer in direct contact with the one or more programmed backside vias.

11. The semiconductor device of claim 10, wherein the backside structure comprises a backside power delivery network.

12. The semiconductor device of claim 10, wherein the one or more placeholder backside vias comprise a dielectric material and the one or more programmed backside vias comprise a conductive material.

13. The semiconductor device of claim 12, wherein the backside metallization layer is in direct contact with the one or more backside vias.

14. The semiconductor device of claim 10, wherein the one or more placeholder backside vias and the one or more programmed backside vias comprise a conductive material.

15. The semiconductor device of claim 14, further comprising, for each of the one or more programmed backside vias, a backside extension via between the backside metallization layer and the respective programmed backside via.

16. The semiconductor device of claim 14, wherein the backside metallization layer is patterned to prevent direct contact with the one or more placeholder backside vias.

17. The semiconductor device of claim 14, wherein the one or more placeholder backside vias are recessed with respect to the one or more programmed backside vias to prevent direct contact with the backside metallization layer.

* * * * *